United States Patent
Kawasaki et al.

(10) Patent No.: US 10,195,716 B2
(45) Date of Patent: Feb. 5, 2019

(54) DRESSER, METHOD OF MANUFACTURING DRESSER, AND METHOD OF MANUFACTURING SEMICONDUCTOR DEVICE

(71) Applicant: TOSHIBA MEMORY CORPORATION, Minato-ku, Tokyo (JP)

(72) Inventors: Takahiko Kawasaki, Aichi (JP); Yukiteru Matsui, Aichi (JP); Akifumi Gawase, Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/429,542

(22) Filed: Feb. 10, 2017

(65) Prior Publication Data
US 2018/0056482 A1 Mar. 1, 2018

(30) Foreign Application Priority Data
Aug. 24, 2016 (JP) .................... 2016-164015

(51) Int. Cl.
*B24B 53/00* (2006.01)
*B24B 53/017* (2012.01)
*H01L 21/306* (2006.01)

(52) U.S. Cl.
CPC ...... *B24B 53/017* (2013.01); *H01L 21/30625* (2013.01)

(58) Field of Classification Search
CPC .......................... H01L 21/30625; B24B 53/017
USPC ....................................................... 451/443
See application file for complete search history.

(56) References Cited

U.S. PATENT DOCUMENTS

| | | | | |
|---|---|---|---|---|
| 5,921,856 A * | 7/1999 | Zimmer | ................. | B24B 37/04 451/539 |
| 6,213,856 B1 * | 4/2001 | Cho | ..................... | B24B 53/017 451/443 |
| 6,293,854 B1 * | 9/2001 | Kimura | ................. | B24B 53/017 451/443 |
| 6,632,127 B1 * | 10/2003 | Zimmer | ................ | B24B 53/017 428/408 |
| 7,066,795 B2 * | 6/2006 | Balagani | ............... | B24B 53/017 451/285 |
| 8,398,466 B2 * | 3/2013 | Sung | ...................... | B24B 53/017 451/443 |
| 9,132,526 B2 * | 9/2015 | Smith | ................... | B24B 53/017 |
| 9,457,450 B2 * | 10/2016 | Chung | ................ | B24B 53/053 |
| 2004/0009742 A1 * | 1/2004 | Lin | ....................... | B24B 53/017 451/56 |
| 2004/0235405 A1 * | 11/2004 | Sung | ....................... | C23C 16/01 451/443 |
| 2005/0025973 A1 * | 2/2005 | Slutz | ..................... | B24B 53/017 428/408 |
| 2009/0224370 A1 * | 9/2009 | Slutz | ..................... | B24B 53/017 257/618 |

(Continued)

FOREIGN PATENT DOCUMENTS

JP 2957519 B2 10/1999

*Primary Examiner* — George Nguyen
(74) *Attorney, Agent, or Firm* — Foley & Lardner LLP (57) ABSTRACT

According to one embodiment, a dresser includes a base metal plate, and a plurality of chip portions that are provided on the base metal plate. Each chip portion includes a Si substrate having a projection at an upper portion thereof and a diamond layer provided on the projection of the Si substrate.

18 Claims, 10 Drawing Sheets

(56) References Cited

U.S. PATENT DOCUMENTS

2013/0344779 A1\* 12/2013 Lee .................. B24B 53/017
                                                    451/443
2014/0154960 A1\*  6/2014 Lee .................. B24B 53/017
                                                    451/443
2014/0273773 A1\*  9/2014 Chou ................. B24B 53/017
                                                    451/443
2015/0290768 A1\* 10/2015 Chou ................. B24B 53/017
                                                    451/443

\* cited by examiner

DRESSER, METHOD OF MANUFACTURING DRESSER, AND METHOD OF MANUFACTURING SEMICONDUCTOR DEVICE

CROSS-REFERENCE TO RELATED APPLICATION

This application claims the benefit of and priority to Japanese Patent Application No. 2016-164015, filed Aug. 24, 2016, the entire contents of which are incorporated herein by reference.

FIELD

Embodiments described herein relate generally to a dresser, a method of manufacturing the dresser, and a method of manufacturing a semiconductor device.

BACKGROUND

In a process of manufacturing a semiconductor device, a chemical mechanical polishing (CMP) technique can be used for planarizing an insulating film, a metal film, and/or a polycrystalline silicon film which are embedded in a groove. In the CMP, the surface of a polishing pad is deformed as the polishing is repeatedly performed, and a polishing performance is degraded. Therefore, the polishing pad is dressed by using a dresser for a certain time interval to suppress the degradation.

DETAILED DESCRIPTION

Some example embodiments described herein set forth an improved dresser, a method of manufacturing the dresser, and a method of manufacturing a semiconductor device.

According to some embodiments, a dresser includes a base metal plate and a plurality of chip portions. The chip portions are provided on the base metal plate. At least one chip portion includes a Si substrate having a projection at an upper portion thereof and a diamond layer provided on the projection of the Si substrate.

First Embodiment

An example dresser according to a first embodiment will be described with reference to FIGS. 1 to 7. Some similar portions and/or components will be denoted by some same symbols in the following description of the drawings. However, the referenced drawings are illustrative schematics that are not necessarily drawn to scale, and any relation between a thickness and a plane dimension, and/or any ratio between component sizes and/or numbers in the drawings may differ from the actual relations or ratios.

Figure 1:
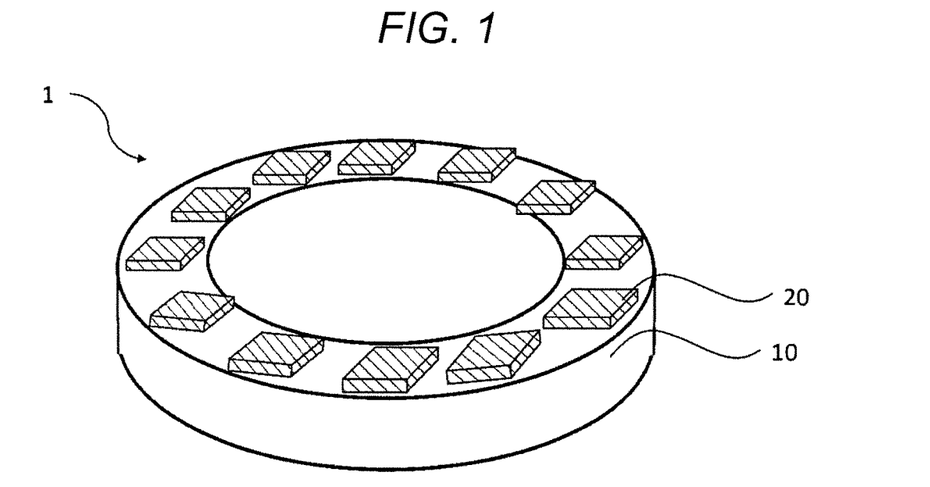
FIG. 1 is a diagram showing a dresser according to a first embodiment.

A configuration of a dresser 1 according to the first embodiment will be described using FIGS. 1 to 2B. FIG. 1 is a plan view schematically illustrating a working surface of the dresser 1 according to the first embodiment. The working surface is a surface that may face a dressing object such as a polishing pad during dressing.

As illustrated in FIG. 1, the working surface of the dresser 1 includes a plurality of chip portions 20 on a base metal plate 10. The base metal plate 10 may include, for example, stainless steel (SUS) or iron, but is not limited to those materials. The chip portion 20 is formed of a Si wafer (Si substrate), for example. The size of the chip portion 20 is, for example, in a range of about 1 millimeter (mm)×about 1 mm to about 50 mm×about 50 mm, but the size of the chip portion 20 according to the first embodiment is not limited to that range. The number of chip portions 20 of the dresser 1 of this embodiment is not limited. A uniform dressing may be easily performed by using the plurality of chip portions 20.

Next, the chip portion 20 will be described in detail. FIG. 2A is a plan view schematically illustrating the chip portion 20, and FIG. 2B is a schematic sectional view taken along a line A-A' of FIG. 2A.

Figure 2A:
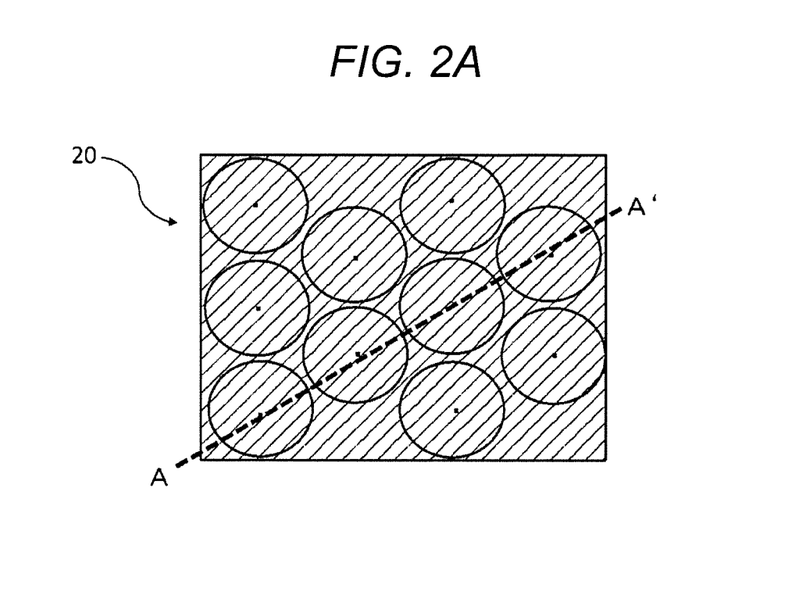
FIGS. 2A and 2B are diagrams showing details of a chip portion of FIG. 1.
Figure 2B:
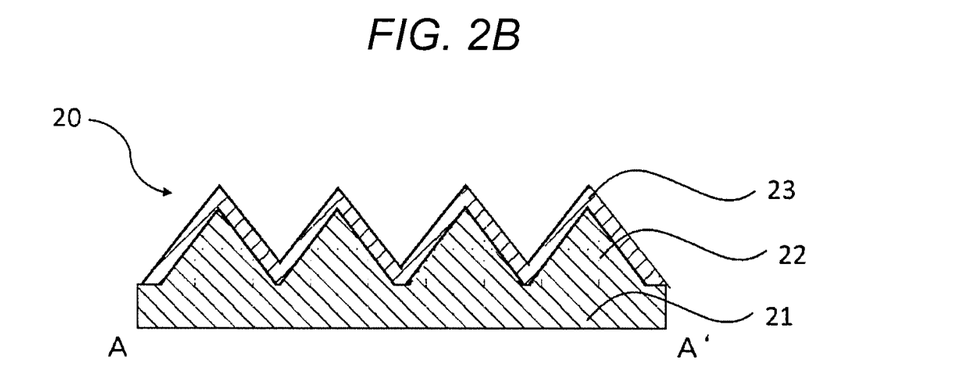

As illustrated in FIGS. 2A and 2B, the chip portion 20 includes a substrate 21 and a plurality of projections 22 on the substrate 21. The projection 22 is formed in an approximately conical shape having a radius of about 0.15 mm, for example. In other embodiments, the projections 22 may have shapes other than conical. In other embodiments, the projections may have radii greater than about 0.15 mm (such as, for example, greater than about 0.20 mm, greater than about 0.30 mm, greater than about 0.50 mm, or greater) or less than about 0.15 mm (such as, for example, less than about 0.10 mm, less than about 0.05 mm, less than about 0.01 mm, or less). The projections 22 are arranged in a honeycomb shape in the chip portion 20 (e.g., arranged in a shape wherein circular projections 22 are closely packed so as to minimize space therebetween). This can help to fit a large number of projections 22 in one chip portion 20. The projection 22 includes Si, for example, and is integrated with the substrate 21. As illustrated in FIG. 23, a diamond layer 23 is formed on the projection 22. The diamond layer 23 can be formed over the entire surface of the projections 22 and any portion of the substrate 21 exposed from the projections 22. In other embodiments, at least some portion of the surface of the projections 22 and/or of the chip portion 20 may be not covered by the diamond layer 23, exposing the at least some portion. The diamond layer 23 is formed in a substantially uniform thickness. The arrangement of the projections 22 in the chip portion 20 is not limited to that illustrated in FIGS. 2A and 2B.

Next, an example method of manufacturing the chip portion and the dresser according to the first embodiment will be described in reference to FIGS. 3A to 63.

FIGS. 3A to 4C are schematic sectional views illustrating a portion of the Si wafer. In the following description of a manufacturing method, it is assumed that the wafer has a uniform structure over the entire surface—however, this need not be the case.

Figure 3A:
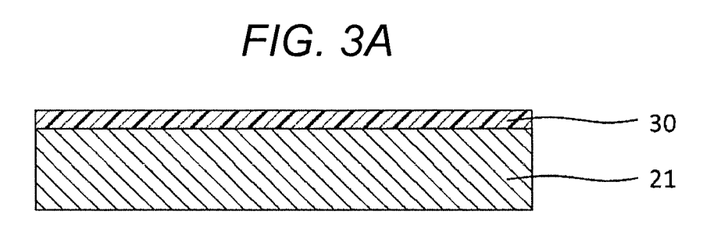
FIGS. 3A to 3D are diagrams showing at least part of a method of manufacturing a chip portion.

As illustrated in FIG. 3A, first the Si wafer is prepared. A base film 30 is formed on the Si wafer using, for example, a Chemical Vapor Deposition (CVD) method. The base film 30 is a tetraethoxysilane (TEOS) film having a thickness of about 500 nm for example. The Si wafer can be a type used in a semiconductor manufacturing process, and may be suitable for costs-effective implementation of the techniques described herein because the Si wafer can be obtained at low cost and has a suitable hardness. A crystal plane in the Si wafer can have a plane orientation of (111) (Si(111)), and can have a high Vickers hardness (for example, about 10.6 gigapascal (Gpa) or more). Si(111) is a structure having an atomic arrangement in which distances between Si particles in the crystal structure are equal. Furthermore, Si may be a suitable material to use, as it may have a thermal expansion coefficient that is almost the same as that of diamond, compared to other material having a high hardness (for example, a thermal expansion coefficient of about $2.56 \times 10^{-6}$/K or less).

Figure 3B:
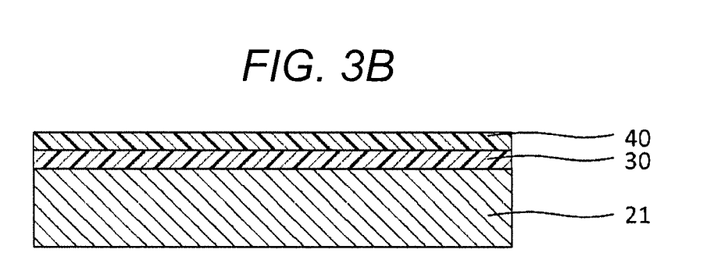
Figure 5:
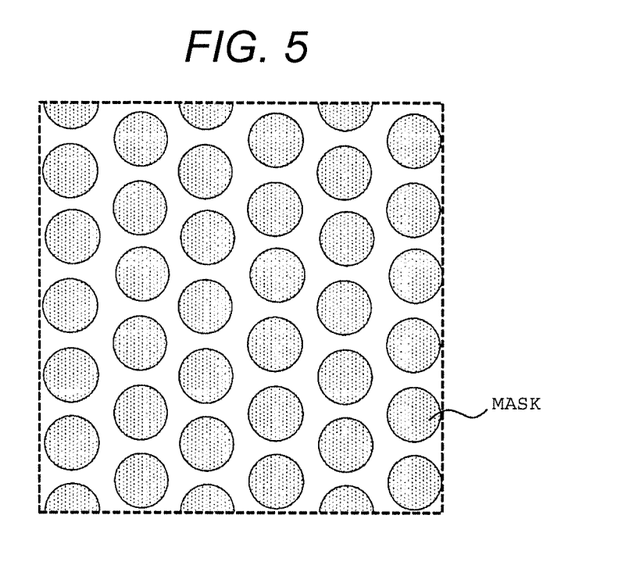
FIG. 5 is a plan view of a mask.

Next, as illustrated in FIG. 3B, a resist film 40 is formed on the base film 30. The resist film 40 is, for example, a resist film for infrared rays (i-ray). Thereafter, for example, the resist film is exposed to the i-ray through a mask (e.g. as illustrated in FIG. 5). However, the type of resist is not limited to i-ray resist.

Figure 3C:
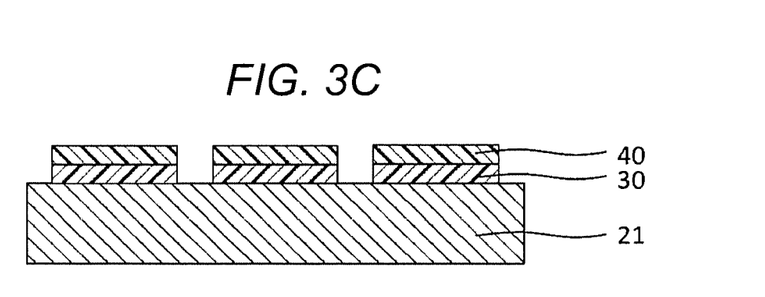

Next, as illustrated in FIG. 3C, the exposed resist film 40 is developed, and then the base film 30 is vertically dry-etched using the resist film 40 as a mask. $CF_4$ gas may be used in this process, for example.

Figure 3D:
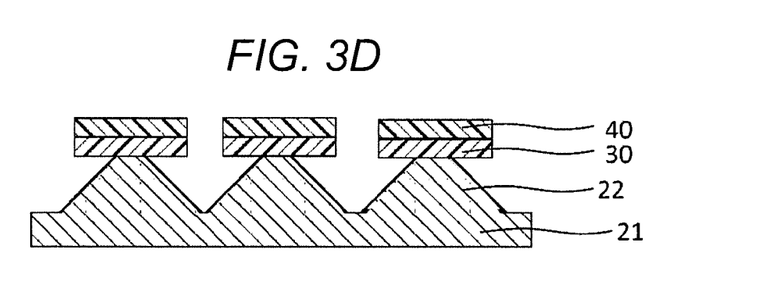
Figure 4A:
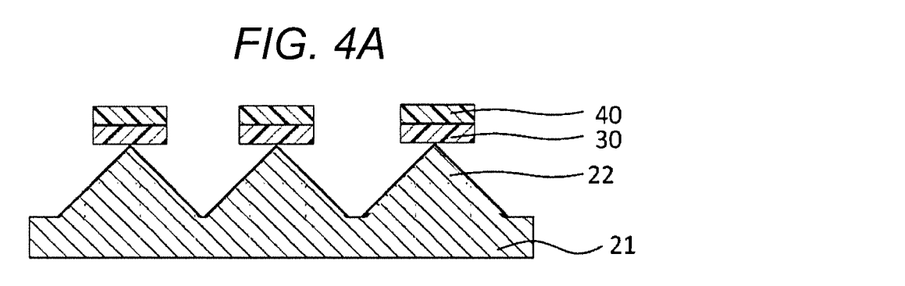
FIGS. 4A to 4C are diagrams showing at least part of a method of manufacturing a chip portion.
Figures 4B, 4C:
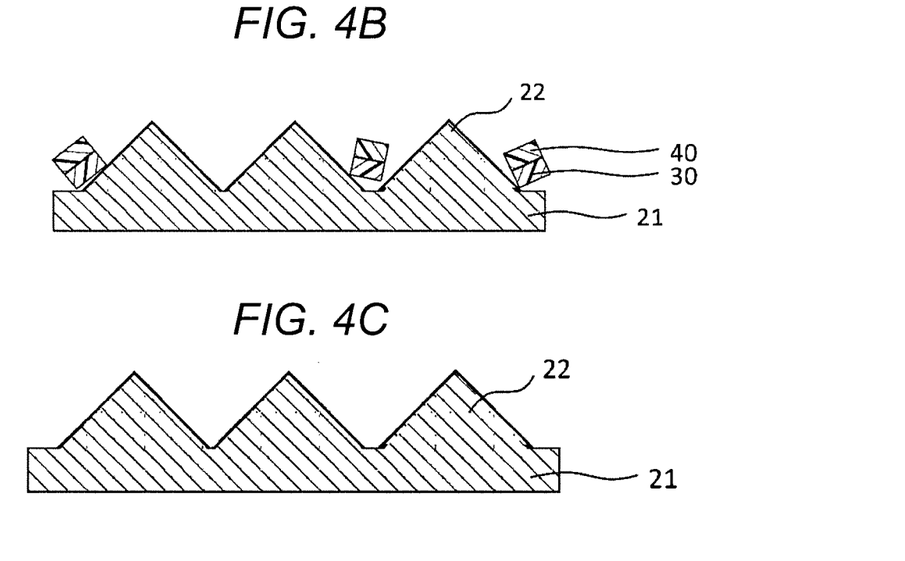

Next, the Si wafer is etched as illustrated in FIG. 3D. For example, the etching is performed using a mixed gas of $SF_6$=about 70 standard cubic centimeters per minute (sccm), $C_4F_8$=about 200 sccm, and $O_2$=about 500 sccm. When the etching is performed under these conditions, the upper end of the Si wafer becomes an approximately conical shape as illustrated in FIG. 4A. During the etching process, the sizes of the resist film 40 and the base film 30 are also reduced. Finally, the plurality of projections 22 having an approximately conical shape are formed in the Si wafer (FIG. 4B). The reduced resist film 40 and the reduced base film 30 may fall down from the peaks of the projections 22 and may come to rest between the projections 22.

Next, the reduced resist film 40 and the reduced base film 30 are removed by, for example, asher or $NH_4OH$ cleansing. Through the above process, a Si wafer is obtained in which the projections have a desired shape, such as an approximately conical shape.

Figure 6A:
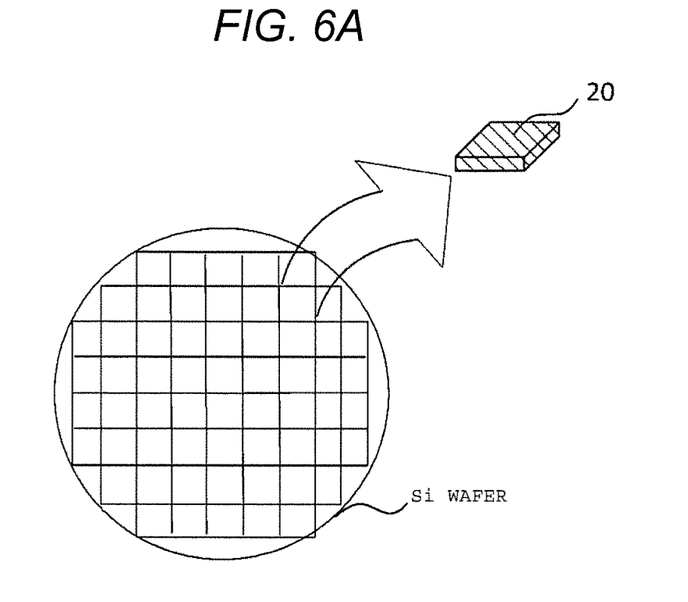
FIGS. 6A and 6B are diagrams showing at least part of a method of manufacturing the dresser according to the first embodiment.

Next, the Si wafer formed with the plurality of projections 22 of an approximately conical shape is diced, and thus the chip portion 20 is obtained as a base plate (FIG. 6A). For example, about 160 or more chip portions 20 can be obtained when using a 300 mm Si wafer, about 70 or more chip portions 20 can be obtained when using a 200 mm wafer. However, these example numbers are meant for reference only, and the number of chip portions obtainable from a Si wafer of a given size is not limited. For example, it may be possible to form chip portions on both sides of a Si wafer, thus approximately doubling the chip portion 20 yield of the Si wafer.

Next, the diamond layer 23 is formed on the chip portion 20 (as shown in FIG. 2B). The diamond layer 23 is formed, for example, using a plasma CVD method with the chip portion 20 being placed on an anode grounded in a pressure-reduced container and heated at about 800 degrees Celsius. Thereafter, a mixed gas of methane and hydrogen is caused to flow under reduced pressure, and a direct current (DC) voltage of about 1000 V is applied to a cathode to perform an abnormal glow discharge. The above described method is given as an example, and variations of the above described method may be performed instead. Thus, the chip portion 20 which includes the projections 22 and the diamond layer 23 can be formed.

Figure 6B:
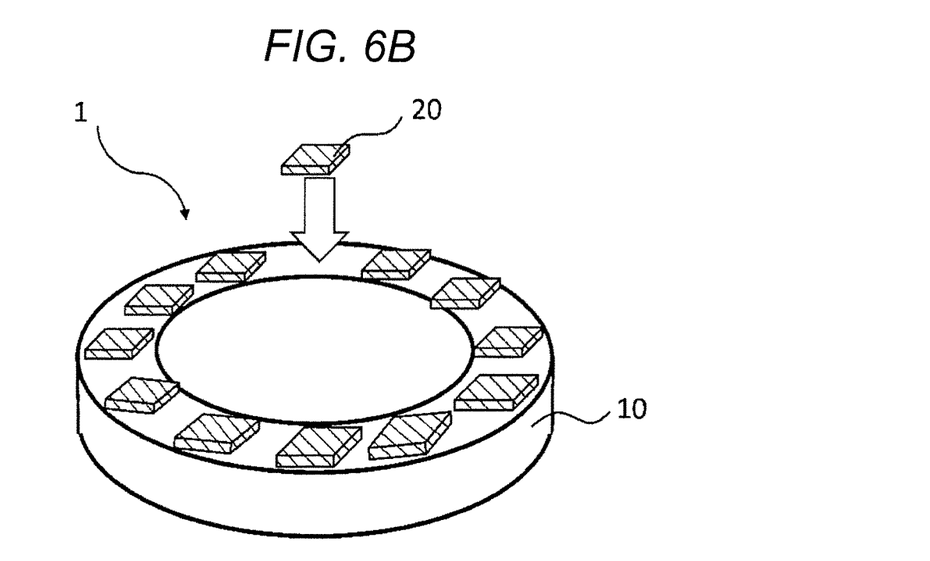

Next, as illustrated in FIG. 6B, a rear surface of the chip portion 20 opposite to the surface on which at least some projections 22 are formed is coated with a resin, and attached to the base metal plate 10, which can include SUS for example. As the resin, a mixture of an epoxy resin and an amine-based adhesive or a mixture of an epoxy resin and a polyamide-amine-based adhesive can be used. The base metal plate 10 can have a ring-like structure for example, but it is not limited thereto.

In some embodiments, the base metal plate partially protrudes at a joining portion between the base metal plate and at least one chip portion. In some embodiments, the base metal plate partially protrudes at a joining portion between the base metal plate and each chip portion.

Thus, the dresser 1 according to the first embodiment can be produced.

Figure 7:
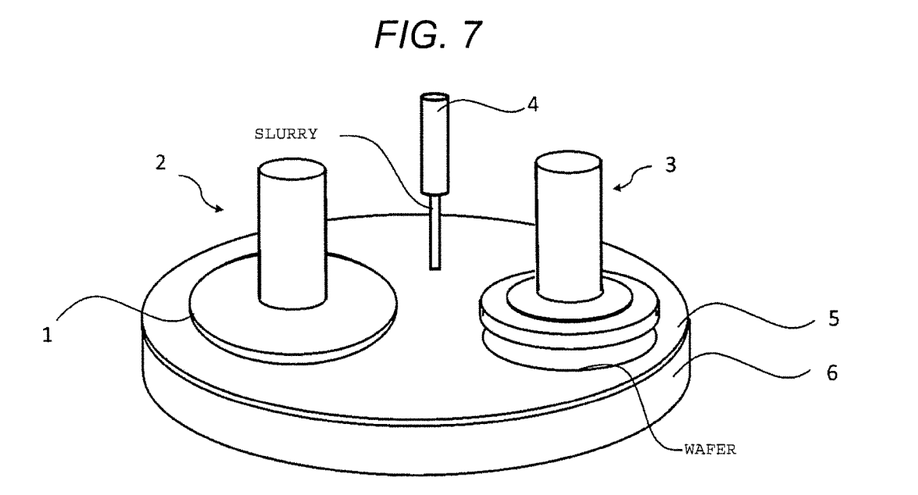
FIG. 7 is a diagram illustrating one example of the dresser 1 in use.

Next, description will be made about a specific example of using the dresser 1 according to the first embodiment.

FIG. 7 is a schematic diagram illustrating a configuration of a polishing device 100. As illustrated in FIG. 7, the polishing device 100 includes a dressing mechanism 2, a polishing head 3, a nozzle 4, a polishing pad 5, and a rotation table 6. Configurations other than the depicted example configuration may be used.

The rotation table 6 is supported by a rotation shaft (not illustrated) from the lower side (rotation table side), and the rotation shaft is driven to rotate by an external driving apparatus, and is rotated at a predetermined speed.

A semiconductor wafer is positioned under the polishing head 3. The wafer is disposed such that the surface to be polished faces the polishing pad 5, and is held by the polishing head 3 (e.g. is clamped down by the polishing head 3). The polishing head 3 is provided with a mechanism which can press the wafer to the rotation table 6.

The nozzle 4 is disposed above the rotation table 6 to discharge slurry. The slurry contains, for example, cerium dioxide as an abrasive grain.

During the polishing process, the slurry is supplied from the nozzle 4 to the polishing pad 5, and the polishing head 3 moves or is pressed down such that it causes the wafer to come into contact with the polishing pad 5. Then, the rotation table 6 and the polishing head 3 are rotated in the same direction. Thereby, at least part of a semiconductor device manufacturing process can be performed by polishing a predetermined polishing material (material to be polished) which is provided on the wafer.

The dresser 1 is provided on the polishing pad 5 in the dressing mechanism 2. The dresser 1 is disposed such that the plurality of projections 22 of the chip portion 20 are positioned on the surface (facing the polishing pad 5 (the working surface). The dressing mechanism 2 causes the dresser 1 to rotate during and/or before and/or after polishing of the wafer, and performs dressing on the polishing pad 5 while oscillating the dresser 1. The surface of the area where the wafer passes through can be thoroughly dressed by using the dressing mechanism 2.

According to the dresser 1 of this embodiment, because the diamond layer is formed on the Si substrate, it is possible to form a dresser that can operate in high temperature environments, compared to a case where the diamond layer is formed on a metal substrate. For example, it is possible to avoid a problem that the metal is eluted when the metal is exposed to a high temperature environment of, for example, about 800 degrees Celsius during the forming of the diamond layer, leading to carbon in the metal becoming soot. Further, since the thermal expansion coefficients of the Si substrate and the diamond are similar, it is possible to avoid a problem that cracks occur in the diamond layer in a high temperature environment.

Furthermore, since the Si substrate is processed in an approximately conical shape and the projections are formed, the dressing of the polishing pad can be performed efficiently. Scraps of the polishing pad that may fall off during a polishing process are less prone to accumulating between the projections, as compared to a dresser which has quadrangular pyramid or other projection shapes.

According to the method of manufacturing the dresser 1 of the first embodiment, the wafer is diced into a plurality of chip shapes by the dicing process after the projections are formed in the Si wafer, and the obtained chip portions are attached to the base metal plate. Therefore, the number of dressers which can be manufactured from one wafer is increased, and production costs can thereby be reduced.

Second Embodiment

Hereinafter, a dresser according to a second embodiment will be described in reference to FIG. 8. The dresser according to the second embodiment is different from that according to the first embodiment in that a chip holding base is used between the base metal plate and the chip portion.

Figure 8:
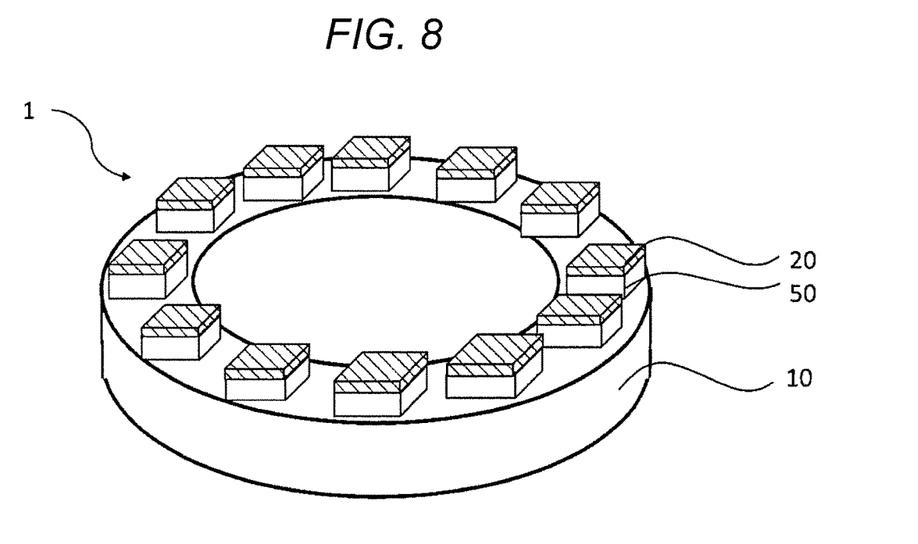
FIG. 8 is a diagram showing a dresser according to the second embodiment.

A configuration of the dresser 1 according to the second embodiment is illustrated in FIG. 8. The structure of the chip portion 20 can be similar to that of the first embodiment, and thus the description thereof will be omitted. As illustrated in FIG. 8, the dresser 1 of this embodiment includes the base metal plate 10 and a plurality of chip holding bases 50 provided on the base metal plate 10. The chip portion 20 is provided on each of the chip holding bases 50.

For example, the chip holding base 50 can include SUS, but the material of the chip holding base 50 is not limited thereto. The chip holding base may include a same material as that of the base metal plate 10, and may be integrally formed as part of the base metal plate 10. The number of chip holding bases 50 is not limited. In the second embodiment, the chip holding base 50 may be integrally formed with, attached to, or recessed in part of the base metal plate 10.

Next, an example method of manufacturing the dresser 1 of the second embodiment will be described in reference to FIGS. 9A and 9B.

First, the chip portion 20 is manufactured. A method of forming the chip portion 20 can be similar to that of the first embodiment, and thus the description thereof will be omitted (see, for example, FIGS. 3A to 4C, and 6A).

Figure 9A:
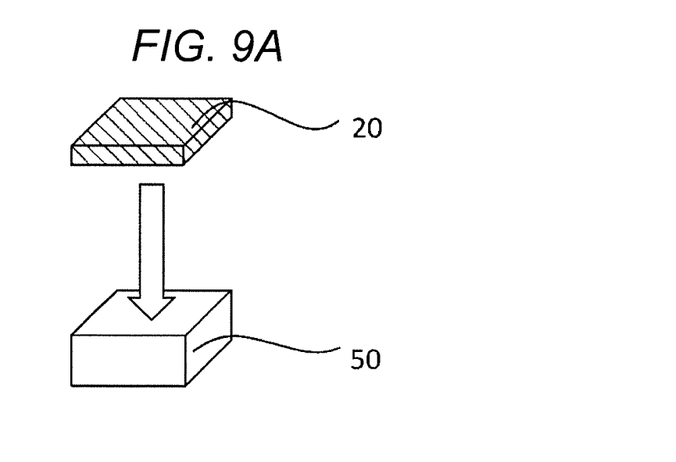
FIGS. 9A and 9B are diagrams showing at least part of a method of manufacturing the dresser according to the second embodiment.
Figure 9B:
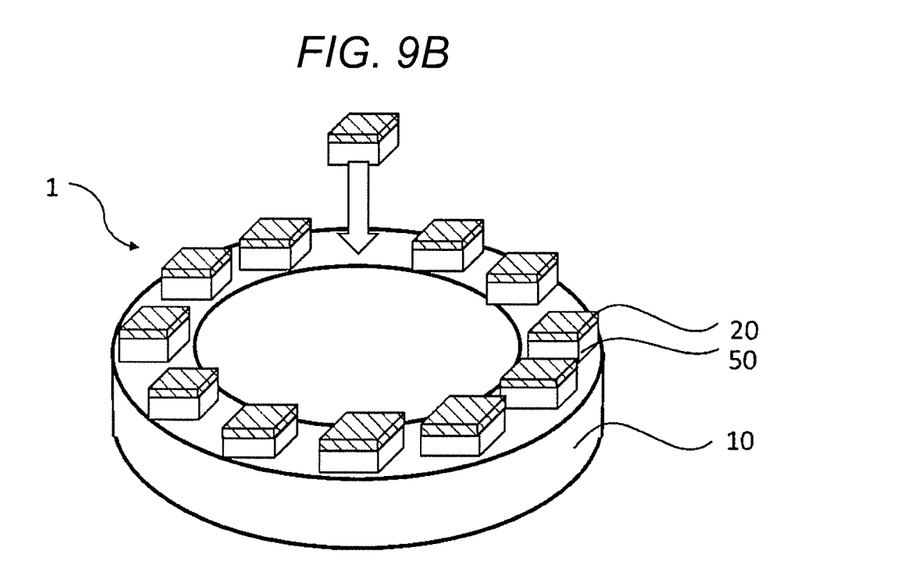

Next, a resin is coated on the rear surface of the chip portion 20 (opposite to the surface on which at least some of the projections 22 and/or the diamond-thin layer are formed), and the chip portion 20 is attached onto the chip holding base 50 (FIG. 9A). As the resin, a mixture of an epoxy resin and an amine-based adhesive can be used, for example.

Finally, the chip holding base 50 attached with the chip portion 20 is fixed to the base metal plate 10 using a screw, for example, or via any other appropriate fastening or adhering means. Thus the dresser 1 of the second embodiment can be formed.

The dresser 1 of the second embodiment, provides advantages similar to those of the first embodiment. Further, it is less likely that the base metal plate 10 will come into contact with the polishing pad during polishing because the chip holding base is provided between the chip portion and the base metal plate. In some other embodiments such as where a polishing pad is soft and a protruding amount of the chip portion from the base metal plate is small, the base metal plate comes into contact with the polishing pad, and the pressure from the chip portion onto the polishing pad may leak to the base metal plate. In order to avoid the above problem, the thickness of the chip portion can be made large using a thick Si wafer. However, a metal chip holding base is used in this embodiment as an alternative to using a thick Si wafer, and thus costs associated with a thick Si wafer can be reduced. In other embodiments, a thick Si wafer and a metal chip holding base can be implemented together.

In the description of some embodiments, a component provided "on" another component can encompass cases where the former component is directly on (e.g., in physical contact with) the latter component, as well as cases where one or more intervening components are located between the former component and the latter component.

While certain embodiments have been described herein, these embodiments have been presented by way of example only, and are not intended to limit the scope of the present disclosure. Indeed, the embodiments described herein may be embodied in a variety of other forms; furthermore, various omissions, substitutions and changes in the form of the embodiments described herein may be made without departing from the spirit of the present disclosure. The accompanying claims and their equivalents are intended to cover such forms or modifications as would fall within the scope and spirit of the present disclosure. Moreover, some or all of the above described embodiments can be combined when implemented.

What is claimed is:
1. A dresser comprising:
a base metal plate; and
a plurality of chip portions that are provided on the base metal plate, each of the chip portions including:
a Si substrate having a projection at an upper portion of the Si substrate, and
a diamond layer provided on the projection of the Si substrate.
2. The dresser according to claim 1,
wherein each Si substrate has a plane orientation of (111).
3. The dresser according to claim 1,
wherein the base metal plate partially protrudes at respective joining portions between the base metal plate and each chip portion.
4. The dresser according to claim 1,
wherein a shape of each projection is a conical shape.
5. The dresser according to claim 1,
wherein at least one chip portion of the plurality of chip portions includes a plurality of projections at an upper portion of the Si substrate of the chip portion arranged to form a honeycomb structure.
6. A method of manufacturing a dresser, comprising:
providing a Si substrate having a plurality of projections on a surface thereof;
preparing a chip portion by cutting the Si substrate into individual pieces, one piece constituting the chip portion, the chip portion including one or more projections of the plurality of projections;
forming a diamond layer on the one or more projections of the chip portion; and
providing the chip portion on a base metal plate.

7. The method of manufacturing the dresser according to claim 6,
wherein the Si substrate is cut into the individual pieces to prepare a plurality of the chip portions, and after the diamond layer is formed on the projections of the plurality of chip portions, the plurality of chip portions are provided on the base metal plate.

8. The method of manufacturing the dresser according to claim 6,
wherein the Si substrate has a plane orientation of (111).

9. The method of manufacturing the dresser according to claim 6,
wherein the Si substrate is a Si wafer.

10. The method of manufacturing the dresser according claim 6,
wherein a shape of each projection is a conical shape.

11. The method of manufacturing the dresser according claim 6,
wherein the chip portion is provided on a chip holding base that is formed on the base metal plate.

12. The method of manufacturing the dresser according claim 6,
wherein the surface of the Si substrate is etched to form the plurality of projections simultaneously.

13. The method of manufacturing the dresser according to claim 6,
wherein the one or more projections of the chip portion are arranged to form a honeycomb structure.

14. A method of manufacturing a semiconductor device, comprising:
providing a semiconductor wafer;
dressing a polishing pad using a dresser, the dresser comprising a base metal plate and chip portions obtained by cutting a Si substrate, at least one chip portion having one or more projections on a surface thereof, the one or more projections covered with a diamond layer, the individual chip portions being provided on the base metal plate; and
polishing the semiconductor wafer using the dressed polishing pad.

15. A method of manufacturing a semiconductor device according to claim 14, wherein the at least one chip portion includes a portion of the Si substrate having a plane orientation of (111).

16. A method of manufacturing a semiconductor device according to claim 14, wherein the base metal plate partially protrudes at respective joining portions between the base metal plate and each chip portion.

17. A method of manufacturing a semiconductor device according to claim 14, wherein a shape of the projection is a conical shape.

18. A method of manufacturing a semiconductor device according to claim 14, wherein the one or more projections of the at least one chip portion are arranged to form a honeycomb structure.

* * * * *